United States Patent
Folta et al.

(10) Patent No.: US 6,562,404 B1
(45) Date of Patent: May 13, 2003

(54) CONFORMAL CHEMICALLY RESISTANT COATINGS FOR MICROFLOW DEVICES

(75) Inventors: James A. Folta, Livermore, CA (US); Mark Zdeblick, Portola Valley, CA (US)

(73) Assignee: The Regents of the University of California, Oakland, CA (US)

( * ) Notice: Subject to any disclaimer, the term of this patent is extended or adjusted under 35 U.S.C. 154(b) by 106 days.

(21) Appl. No.: 09/645,826

(22) Filed: Aug. 25, 2000

(51) Int. Cl.[7] .............................................. C23C 16/34
(52) U.S. Cl. ........................ 427/255.393; 427/255.394; 438/780
(58) Field of Search ................................. 422/240, 241, 422/310; 428/34.1; 427/255.393, 255.394; 438/780

(56) References Cited

U.S. PATENT DOCUMENTS

| | | | | |
|---|---|---|---|---|
| 5,633,552 A | * | 5/1997 | Lee et al. ................ | 310/311 |
| 5,824,204 A | | 10/1998 | Jerman ..................... | 204/601 |
| 5,855,801 A | * | 1/1999 | Lin et al. .................. | 216/2 |
| 6,096,656 A | * | 8/2000 | Matzke et al. ............ | 205/122 |

FOREIGN PATENT DOCUMENTS

| WO | WO-99/241141 | * 5/1999 |
|---|---|---|
| WO | WO-99/61147 | * 12/1999 |

OTHER PUBLICATIONS

J. G. E. Gardeniers, et al., Corrosion of Protective Layers on Strained Silicon Surfaces in Alkaline Solutions, Sensors and Materials, 5, 4 (1994) 189–208.

* cited by examiner

*Primary Examiner*—Timothy Meeks
(74) *Attorney, Agent, or Firm*—L. E. Carnahan; Alan H. Thompson

(57) ABSTRACT

A process for coating the inside surfaces of silicon microflow devices, such as electrophoresis microchannels, with a low-stress, conformal (uniform) silicon nitride film which has the ability to uniformly coat deeply-recessed cavities with, for example, aspect ratios of up to 40:1 or higher. The silicon nitride coating allows extended exposure to caustic solutions. The coating enables a microflow device fabricated in silicon to be resistant to all classes of chemicals: acids, bases, and solvents. The process involves low-pressure (vacuum) chemical vapor deposition. The ultra-low-stress silicon nitride deposition process allows 1–2 $\mu$m thick films without cracks, and so enables extended chemical protection of a silicon microflow device against caustics for up to 1 year. Tests have demonstrated the resistance of the films to caustic solutions at both ambient and elevated temperatures to 65° C.

3 Claims, 1 Drawing Sheet

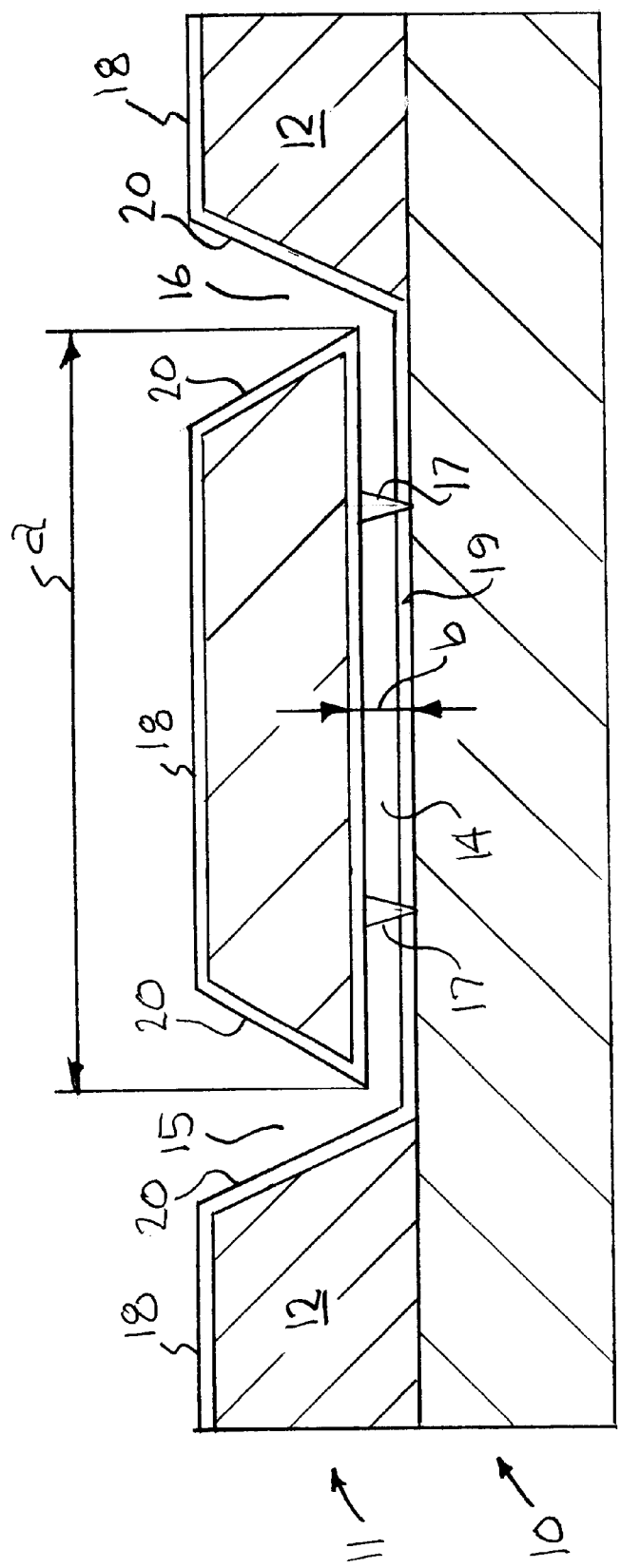

CONFORMAL CHEMICALLY RESISTANT COATINGS FOR MICROFLOW DEVICES

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to silicon microflow devices, particularly to coating the inside surfaces of silicon microflow devices, and more particularly to a process for forming a conformal chemically resistant coating on deeply-recessed cavities with aspect ratios of up to 40:1 and higher.

Many different types of microflow devices and systems are being developed for wide ranging applications, particularly for analytical systems. One of the key limitations of microflow devices is the ability to make them resistant to chemical attack. The standard method for building microflow devices is to etch flow channels into the surface of a material (e.g., silicon wafer) and then bond wafers together to form the microflow system or device. If the material is not resistant to the environment for which the device is intended, the etched surfaces need to be coated with a chemically resistant material either before or after the bonding procedure. Coating the surfaces before bonding usually interferes with the bonding process (e.g., the coated surfaces usually do not adhere well to one another). Coating the surfaces after bonding represents a challenge in that most of the surfaces to be protected are buried inside of a microflow system with small and isolated access ports. Furthermore, thick coatings which can withstand chemical attack for extended periods tend to form stress-induced cracks which render such films useless.

Of particular interest is the need for a coating which is resistant to caustic (basic) solutions. Silicon and glass, the two most common materials to build microflow systems or devices, are already resistant to solvents and acids.

Corrosion protection of silicon from caustic solutions using a protective layer of silicon nitride has been previously shown. See J. G. E. Gardeniers, et al., "Corrosion of Protected Layers on Strained Silicon Surfaces in Alkaline Solutions," Sensors and Materials; 5, 4, 189–208 (1994). While this paper showed the resistance of silicon nitride to caustic solutions, there remains a need for conformally coating silicon with silicon nitride, particularly in recessed cavities. Another prior approach has been to form silicon nitride channels in a silicon member and then bonding to channels to a glass substrate. See U.S. Pat. No. 5,824,204 issued Oct. 20, 1998 to J. H. Jerman.

It has also been established that simple deposition of 1–2 $\mu$m thick silicon nitride films by conventional deposition techniques resulted in microcracks in the silicon nitride which are not visible by any standard microscopic techniques until the film is exposed to a caustic solution. Then the microcracks are "decorated" by the solution and the film degrades quickly because the underlying silicon is rapidly attacked by the caustic solution.

The present invention is directed to a process to coat the inside surfaces of silicon microflow devices with a low-stress, conformal (uniform) silicon nitride film which has the ability to penetrate deeply into recessed cavities (of aspect ratios up to 40:1 or higher) without microcracks in the film. The process involves low-pressure (vacuum) chemical vapor deposition. The 1–2 $\mu$m thick silicon nitride film produced by the process of this invention enables extended exposure of silicon devices to caustic solutions. Thus, by this process, microflow systems fabricated in silicon will be resistant to all classes of chemicals: acids, bases, and solvents.

SUMMARY OF THE INVENTION

It is an object of the present invention to provide silicon microflow devices which are resistant to all classes of chemicals.

A further object of the invention is to provide a process for depositing silicon nitride films which are free of microcracks.

A further object of the invention is to provide conformal chemically resistant coatings for microflow devices or systems.

Another object of the invention is to provide a process for coating the inside surfaces of silicon microflow devices with a low-stress, crack-free, conformal silicon nitride film.

Another object of the invention is to provide a process which enables uniform coating of silicon nitride in deeply-recessed cavities with aspect ratios of up to 40:1 or higher.

Another object of the invention is to provide an ultra-low-stress silicon nitride deposition process which enables 1–2 $\mu$m thick deposition without cracks, and so enables extended chemical protection of silicon microflow devices against caustics for up to 1 year.

Other objects and advantages of the present invention will become apparent from the following description and accompanying drawing. Basically, the present invention involves a conformal (uniform) chemically resistant coating for silicon microflow devices or systems. The invention involves a process for coating the inside surfaces of silicon microflow devices with a low-stress, crack-free, conformal silicon nitride film which has the ability to uniformly coat deeply-recessed cavities with aspect ratios of up to 40:1 or higher. The process is a low pressure (vacuum) chemical vapor deposition process which can be used at both ambient and elevated temperatures up to 65° C., and can produce silicon nitride films with thicknesses of 1–2 $\mu$m without cracks, such film thickness being needed to withstand caustic exposure for 1 year. By the ultra-low-stress process of this invention silicon nitride films can be uniformly deposited crack free on the inside silicon surfaces, whereby prior known chemical vapor deposition techniques were insufficient to achieve the thick (1–2 $\mu$m) films required.

BRIEF DESCRIPTION OF THE DRAWINGS

The accompanying drawing, which is incorporated into and forms a part of the disclosure, illustrates an embodiment for carrying out the invention and, together with the description, serves to explain the principles of the invention.

The single FIGURE is a cross-sectional view of a silicon microflow device illustrating the film produced by process of the present invention.

DETAILED DESCRIPTION OF THE INVENTION

The present invention is directed to conformal chemically resistant coatings for microflow devices. The invention involves a process to coat the inside surfaces of silicon microflow devices with a low-stress, conformal (uniform) silicon nitride film which has the ability to uniformly coat deeply-recessed cavities with aspect ratios of up to 40:1 or higher. The silicon nitride film has a low stress of 0–600

MPa (generally 200 MPa) and a thickness of 1–2 μm with no microcracks therein. The silicon nitride coating of the silicon surfaces enables extended exposure to caustic solutions. It has been determined that a 1–2 μm thick silicon nitride film extends chemical protection of silicon against caustics for up to 1 year. The process is a low-pressure (vacuum) chemical vapor deposition process that produces an ultra-low-stress silicon nitride film without microcracks, the standard silicon nitride deposition processes being insufficient to achieve the thick (1–2 μm) crack-free films required.

Typical operating range of conditions of the vacuum chemical vapor deposition process of this invention are as follows: 150–750 mTorr, 775–875° C., with dichlorosilane-to-ammonia ratio of 3:1 to 20:1. A specific example of operating conditions of the process is: 480 mTorr, 800° C., with dichlorosilane-to-ammonia gas flow ratio of 6:1.

The process is primarily for protection of silicon-based microflow devices. The high deposition temperature makes the process incompatible with many other materials, such as glass. Furthermore, the process has been optimized to be compatible with the thermal expansion behavior of silicon—the silicon nitride films may crack when deposited on other materials owing to excessive film stress.

A demonstration of coating conformality is described hereinafter with reference to the drawing. In the demonstration, the geometry of the microflow structure was a wide rectangular slot with a rectangular port on each end. FIG. 1 is a cross-section view of the test structure and comprises a pair of bonded silicon members 10 and 11, with member 11 being composed of end sections 12 and center section 13 partially cut away to form a slot or channel 14 and ports 15 and 16 at opposite ends. Center section 13 is supported by a pair of pedestals or stems 17. The length of channel 14 was 8.23 mm between ports 15 and 16, as indicated by arrow (a), and the width of channel or slot 14 (into the plane of FIG. 1) was 8.2 mm, with a height of 0.1 mm, as indicated by arrow (b). Therefore the aspect ratio of the channel 14 to be coated was roughly 4.15:0.1 equaling 40:1, or 40 times longer than it was high. The length of channel 14 was divided in half because of the ports 15 and 16 at each end. The silicon nitride was deposited on the outer surfaces of silicon sections 12 and 13 of silicon member, in ports 15 and 16, and in channel or slot 14, with the coating thickness on the outside of the bonded wafer surface, indicated at 18 being 1380 Å, and the coating thickness on the inside surfaces, indicated at 19, was 1150 Å. In view of the length of channel 14, the coating was deposited via both ports 15 and 16, and the coating in channel 14, 4.15 mm remote from the access ports 15 and 16, was the same, 1150 Å. This represented a coating thickness 19 in channel 14 of 83% of the fully exposed outer surface 18 of the silicon member 11. The tapered surfaces 20 of ports 15 and 16 were coated with a thickness intermediate that of outer surfaces 18 and inner or channel surfaces 19.

Tests have also demonstrated the resistance of the deposited silicon nitride films or coatings to caustic solutions at both ambient and elevated temperatures to 65° C., as exemplified below. Tests have also shown that silicon nitride films of 1–2 μm thickness are needed to withstand caustic exposure for 1 year. By the deposition process of this invention ultra-low-stress (100 MPa) silicon nitride films have been deposited to a thickness of 1–2 μm without cracks, and so enable extended chemical protection of silicon microflow devices against caustics for up to 1 year. Thus, the silicon nitride coating produced by this invention will allow a microflow device fabricated in silicon to be resistant to all classes of chemicals: acids, bases, and solvents.

The following illustrates demonstrations of extended chemical resistance of the silicon nitride film to caustics:

1. Immersion tests: room temperature, 25° C., dissolution rate was 0.1 Å/hr; so that a 1 micrometer thick coating would last 100,000 hrs. (10 years) of full time exposure.

2. Immersion tests: elevated temperature, 65° C., dissolution rate was 5 Å/hr; so that a 1 micrometer thick coating would last 2,000 hrs. (2.8 months) of full time exposure.

3. Flow tests in a microflow device: elevated temperature, 60° C., dissolution rate was 1.3 Å/hr; so that a 1 micrometer thick coating would last 2,000 hrs. (2.8 months) of full time exposure.

It has thus been shown that the present invention provides a process to coat the inside surfaces of silicon microflow devices with a low-stress (100–600 MPa), conformal (uniform) silicon nitride film which has the ability to penetrate deeply into recessed cavities (aspect ratio of up to 40:1 or higher). The silicon nitride coating enables extended exposure of silicon microdevices to caustic solutions, and will enable the devices to be resistant to all classes of chemicals: acids, bases, and solvents.

While particular parameters and materials for carrying out the process of the invention, and a particular embodiment formed by the process have been described and/or illustrated to exemplify and explain the principles of the invention, such are not intended to be limiting. Modifications and changes may become apparent to those skilled in the art, and it is intended that the invention be limited only by the scope of the appended claims.

What is claimed is:

1. A process for forming a conformal chemically resistant coating on inside surfaces of silicon microflow devices, comprising:

depositing a 1–2 μm thick film of silicon nitride having a stress of up to 600 MPa on the inside surfaces by vacuum chemical vapor deposition, using a vacuum pressure of 480 mTorr, temperature of 800° C., with dichlorosilane-to-ammonia gas ratio of 3:1 to 20:1.

2. A process for extending the useful lifetime of microflow devices formed in silicon, comprising:

forming a conformal 1–2 μm thick, low-stress, silicon nitride film having a stress of up to 600 MPa on inside surfaces of recessed cavities having an aspect ratio of 40:1 or higher of the microflow device using a vacuum chemical vapor deposition process, the process being carried out using dichlorosilane and ammonia gas sources and using a vacuum of 480 mTorr and temperature of 800° C.

3. The process of claim 2, wherein the dichlorosilane-to-ammonia gas ratio is 3:1 to 20:1.

* * * * *